United States Patent [19]

Mallet et al.

[11] Patent Number: 4,858,074

[45] Date of Patent: Aug. 15, 1989

[54] METHOD OF ASSEMBLING POWER CIRCUITS AND CONTROL CIRCUITS ON SEVERAL LEVELS IN THE SAME MODULE AND A MODULE THUS OBTAINED

[75] Inventors: Jean-Louis Mallet; Jean-Louis Landais, both of Merignac, France

[73] Assignee: Power Compact, Societe Anonyme, Merignac, France

[21] Appl. No.: 184,955

[22] Filed: Apr. 22, 1988

[30] Foreign Application Priority Data

Apr. 22, 1987 [FR] France ............................ 87 05876

[51] Int. Cl.⁴ .......................... H05K 1/14; H05K 3/36
[52] U.S. Cl. ..................................... 361/388; 29/830; 361/412
[58] Field of Search .................. 361/412–415, 361/383, 386, 387, 388, 395; 29/830, 832; 174/68.5

[56] References Cited

U.S. PATENT DOCUMENTS

| | | | |
|---|---|---|---|
| 2,740,097 | 3/1956 | Edelman et al. | 361/412 X |
| 2,853,656 | 9/1958 | Dowds | 361/412 |
| 3,383,565 | 5/1968 | Gritton . | |
| 3,924,918 | 12/1975 | Friend | 361/412 X |
| 4,092,487 | 5/1978 | Imai . | |
| 4,225,900 | 9/1980 | Ciccio et al. | 361/403 X |
| 4,386,390 | 5/1983 | Hammond | 361/412 |
| 4,558,510 | 12/1985 | Tani et al. . | |

FOREIGN PATENT DOCUMENTS 0138697 4/1985 European Pat. Off. .
2080949 11/1971 France .

Primary Examiner—Howard N. Goldberg
Assistant Examiner—Carl J. Arbes
Attorney, Agent, or Firm—Foley & Lardner, Schwartz, Jeffery, Schwaab, Mack, Blumenthal & Evans

[57] ABSTRACT

The invention provides a method for assembling power circuits and control circuits on several levels in the same module and the module thus obtained, which method consists in grouping on one so called low level the power circuits (1) in grouping on at least one so called mid-height level (3) the control circuits, in forming the electric connections between the circuits of the two levels of elements in the form of helical springs (4) made from a relatively rigid and weldable metal material, disposed vertically, in welding the lower ends of the springs (4) to the appropriate positions of the circuits of the low level (1) while holding the springs in position by means of a guide plate (13), in fixing the wall (6) of the module, in placing inside the wall, by means of positioning projections, (8) the substrate (3) carrying the control circuits, in welding the upper ends of the springs (4) to the appropriate positions on the upper face of the substrate and, finally, in filling the inside of the wall with resin.

8 Claims, 2 Drawing Sheets

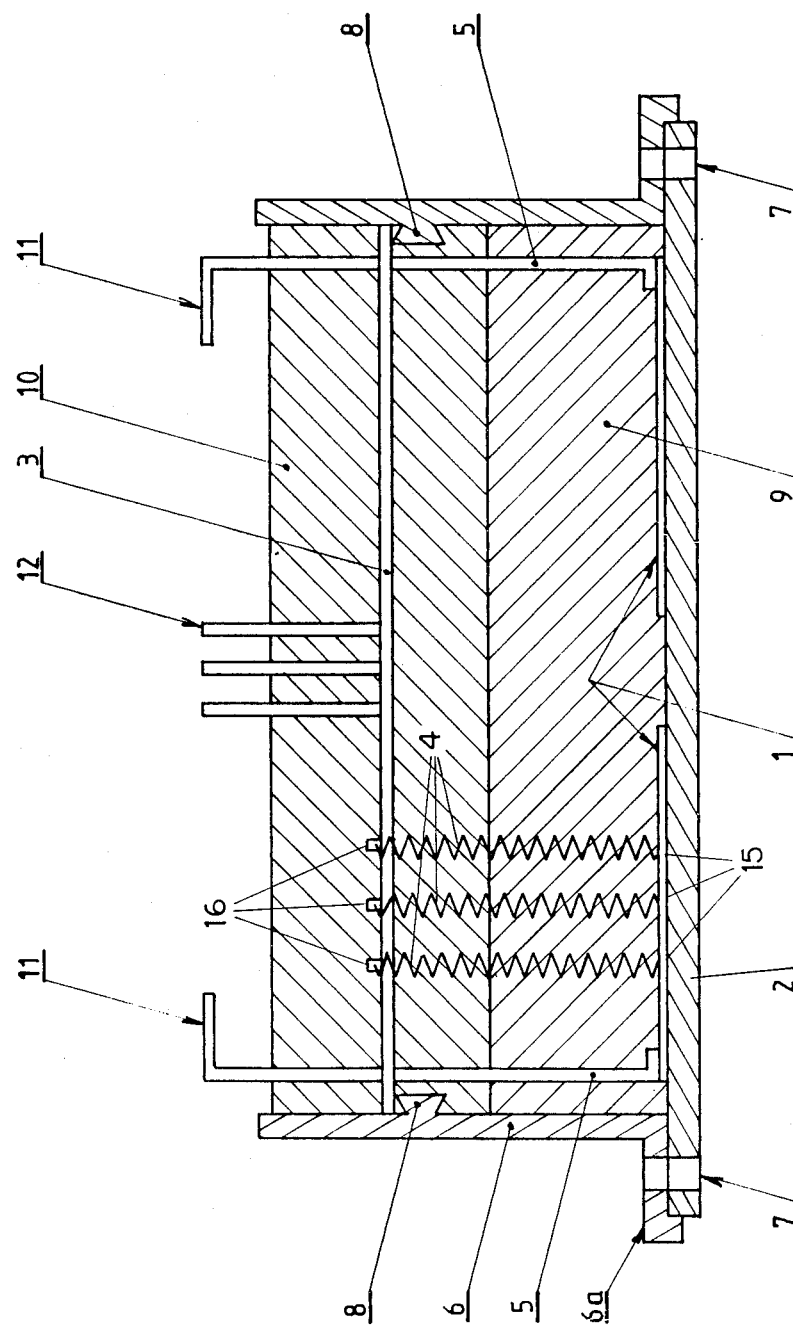
FIG_3_

METHOD OF ASSEMBLING POWER CIRCUITS AND CONTROL CIRCUITS ON SEVERAL LEVELS IN THE SAME MODULE AND A MODULE THUS OBTAINED

The present invention relates to a method for assembling power circuits and control circuits on several levels in the same module.

Electronic power modules generally comprise both power semiconductors and control circuits on the same support base. A characteristic of the first is to dissipate heat and for this reason they are fixed to one or more ceramic material wafers which are themselves fixed, by bonding or welding, to a metal base for dissipating the heat generated by said power circuits.

The control circuits, which dissipate little or no heat, are also mounted on ceramic wafers at the side of the power circuits, which raises the double problem of space at the surface of the module and the danger of thermal drift to which the control circuits are generally subject, which risk is reinforced by the very close presence of heat dissipating circuits.

The aim of the invention is to overcome these drawbacks by providing a new technique for assembling power circuits and control circuits at several levels in the same module.

For this, the invention provides a method for assembling power circuits and control circuits on several levels in the same module, characterized in that it consists:

in grouping together in a so called low level the power circuits mounted on one or more ceramic wafers solidly fixed to a heat dissipating base, in grouping together in at least one so called mid height level the control circuits, mounted on an appropriate substrate, in providing the electric connections between the circuits of said two levels by elements in the form of helical springs made from a relatively rigid and weldable metal material, disposed vertically, in welding the lower ends of said springs to appropriate positions of the low level circuits, by holding the springs in position by means of a guide plate pierced with holes for passing the springs therethrough, said plate also serving for positioning power connectors for welding thereof, in fixing the wall of the module on said base, in placing inside of the wall, by means of positioning projections formed on the internal face of said wall, the substrate carrying the control circuits, in welding the upper ends of said springs to appropriate positions on the upper face of said substrate, having for this purpose holes for passing the springs therethrough and, finally, in filling the inside of the wall with resin by covering the low level and the mid height level, the power and small signal connectors projecting from the resin layer.

Such a technique makes it possible to obtain rapidly and readily remarkably compact modules which are insensitive to the expansion problems related to temperature rises, as well as to shocks and are therefore particularly reliable.

Other features and advantages will be clear from the following description of one embodiment of the method of the invention, which description is given by way of example only with reference to the accompanying drawings in which:

FIG. 3 is a vertical cross section of a module in accordance with the invention.

Figures 1, 2:
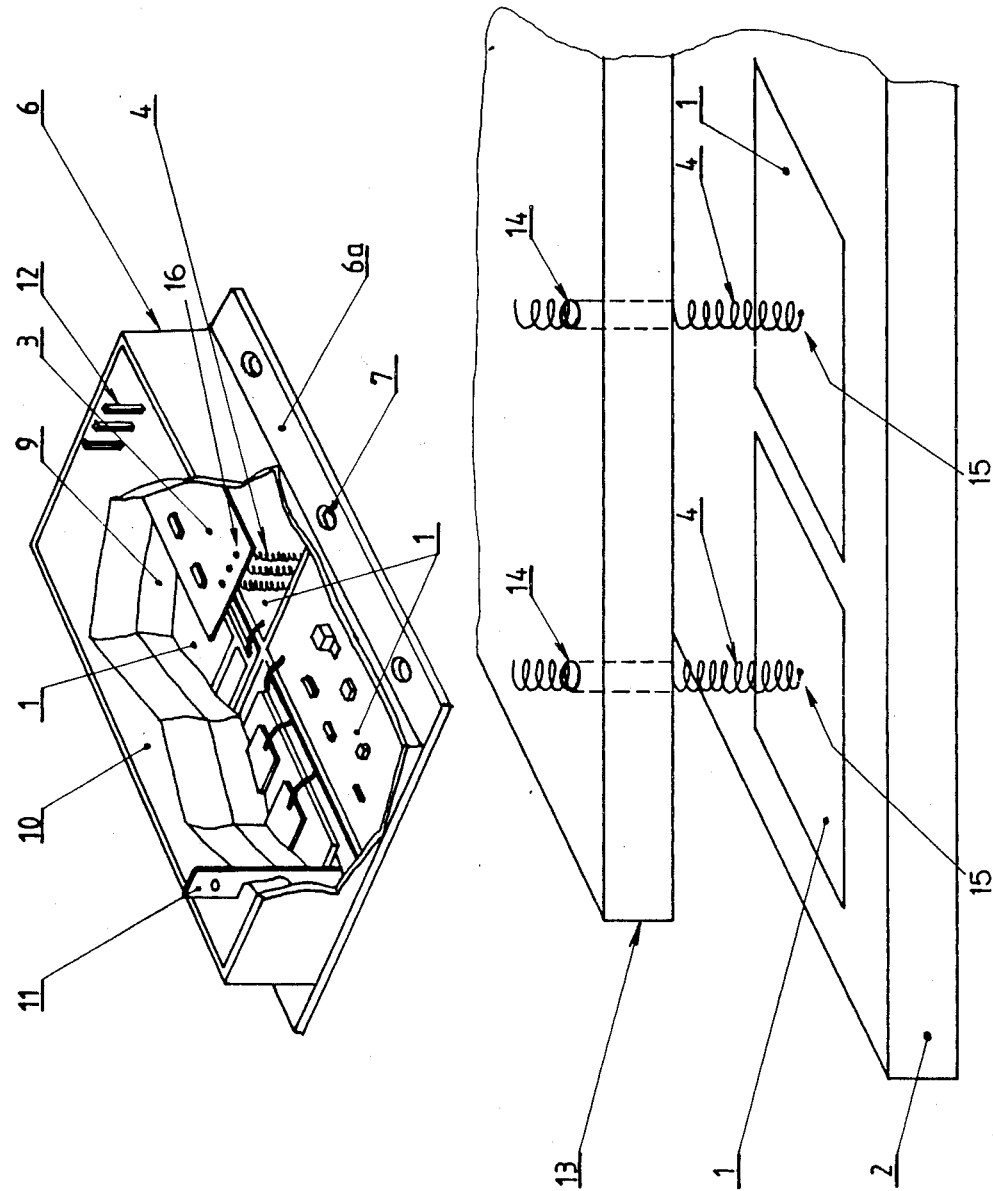
FIG. 1 is a perspective view with parts cut away of a module according to the invention.
FIG. 2 illustrates the phase for welding the lower end of the electric connection springs between the two levels of a module of the invention.

The modules shown schematically in FIGS. 1 and 3 are power modules whose components and circuits are grouped together on two superimposed levels.

In the low level are grouped together the so called power circuits, namely those likely to generate heat and which are fixed to or formed on several ceramic material wafers 1, themselves fixed by welding or bonding for example to a base 2, made from copper or alumina more particularly, whose role is to dissipate the heat.

At a so called mid height level are grouped together the so called control circuits which are formed or fixed on a substrate formed by a wafer 3 of varying dimensions depending on the number of circuits carried, the arrangement of the electric connections 4 between the two levels and the distribution of the power connectors 3 bringing to the surface of the module the terminals giving access to the power circuits of wafers 1.

The circuits are contained inside an open insulating case called wall 6, completely surrounding the circuits, and having lateral flanges 6a and fixed to base 2. Holes 7 formed in the lateral flanges 6a at the periphery of base 2 allow the module to be fixed to its reception support.

The electric connections 4 between the two levels are provided, in accordance with the invention, by elements in the form of helical springs made from a relatively rigid metal material permitting welding. The diameter of springs 4 is for example of the order of a millimeter. The springs all have the same length. They are welded at their lower end at appropriate positions 15 to wafers 1, and at their upper end to the appropriate position 16 of the circuits carried by the mid height wafer 3. For this, wafer 3 is formed with passage holes for the ends of springs 4 so that these latter may be welded after positioning of wafer 3.

To facilitate the correct and accurate positioning of wafer 3, it rests on a seat formed by one or more projections 8 formed on the internal face of the wall. The projection or projections 8 are preferably made by molding at the same time as wall 6 and extend over the whole inner periphery of the wall or not.

Wafer 3 does not necessarily bear on projections 8 over the whole of its periphery; it may do so only at both ends in the case of a narrow wafer. Wafer 3 of course leaves a free passage for the power connectors 5.

Wafer 3 is thus perfectly positioned parallel to wafers 1.

Wafer 3 carries for example different printed circuits as well as surface mounted components fixed to the upper face and possibly to the lower face of plate 3.

By way of example, the low circuits carried by the wafers 1 are covered by a first soft resin 9, such as a silicone resin, this first layer having disposed thereover a second harder resin 10, such as epoxy resin, burying the mid height level of the module.

Of course, a single type and s single layer of resin may be provided embedding the whole of the circuits.

At the surface of the module the power connectors 5 project whose ends may be curved so as to form screwing terminals 11, for connection of the low circuits to the electronic power circuit for which the module is intended and also the so called small signal connectors 12 connected to the mid height circuits of the wafer 3.

To ensure that the mid height circuits are held correctly in position, projections 8 advantageously have a dovetail section or similar to which the resin layer 10 clings and is locked. Any other section, including rectangular or square, of projections 8 is obviously possible.

These modules are manufactured in the following way:

After the circuits of the wafer 3 and the circuits of wafers 1 have been formed and fixed to base 2, the springs 4 are welded at their lower end to wafers 1 by means of a guide plate 13 (FIG. 2) pierced with cylindrical holes 14 very slightly larger than the diameter of the springs 4.

Plate 13 is placed above plate 2, parallel thereto, so that said holes 14 are situated in line with the positions on wafers 1 where springs 4 are to be welded. Spring 4 are fitted into the holes 14. The thickness of plate 13 is sufficient to keep perfect verticality of the springs.

Once the lower ends of springs 4 have been welded to the circuits of wafers 1, plate 13 is removed. Because precisely of their elastic rigidity, springs 4 remain vertical and come back of their own accord to the vertical position after a shock so that the following phase of the process, namely the positioning of wall 6 and the placing of wafer 3 on seat 8 so that the upper ends of springs 4 pass through the holes formed in wafer 3, presents no difficulty. The holes in wafer 3 have a diameter slightly greater than that of springs 4. With the wafer 3 in position, the upper ends of the springs project slightly to a constant height above the wafer so that welding of these ends to the circuits of the wafer 3 presents no difficulty.

Then, the two resins 9 and 10 are molded, or the resin if there is only one. The resilient connections 4 thus formed withstand without problem possible expansion resulting from a temperature rise, whether it comes from the power circuit of the low level or from the environment of the module, as well as shocks.

In the embodiment described and shown, it has been a question of a two level module, but of course a number of levels greater than two could be provided, by superimposing above base 2 several substrates such as 3, at several heights and connected together by spring electric connections identical to the above connections 4.

Finally, the invention is not limited to the embodiments described or mentioned above but covers on the contrary all variants thereof particularly in so far as the characteristics of springs 4 are concerned (diameter, pitch, nature of the material forming them, diameter of the wire used) which may vary depending on the applications, as well as the forms, arrangements and dimensions of the means 8 for supporting and positioning wafer 3 carrying the mid height circuits.

We claim:

1. A power module having power circuits and control circuits, comprising:
   a ceramic substrate fixed to a heat dissipating base;
   a plurality of power circuits mounted to said ceramic substrate to form a lower level;
   a plurality of control circuits mounted to a desired substrate to form a middle level over said lower level;
   at least one electrically conductive spring means providing electrical connection between said lower and middle levels;
   said electrically conductive spring means being disposed substantially perpendicular to said lower and middle levels, said electrically conductive spring means being welded to desired positions in said lower level and said middle level; and
   at least one resin material embedding said lower and middle levels.

2. The power module according to claim 1, further comprising a wall enclosing said lower and middle levels, said wall having a seat formed thereon for receiving said middle level substrate.

3. The power module according to claim 2 wherein said seat forms a dovetailed joint.

4. The power module according to claim 1, wherein said resin material is a soft resin material for absorbing any thermal expansion which occurs in said power circuits and wherein said electrically conductive spring means is a helical spring.

5. The power module according to claim 1, wherein said resin material comprises:
   a first layer of a soft resin material for absorbing any thermal expansion which occurs in said power circuits;
   said first layer embedding said lower level; and
   a second layer of a harder resin material embedding said middle level.

6. A method of assembling a power module having power circuits and control circuits, comprising:
   fixing a ceramic substrate to a heat dissipating base;
   mounting a plurality of power circuits to said ceramic substrate a form a lower level;
   mounting a plurality of control circuits to a desired substrate to form a middle level over said lower level;
   electrically connecting said lower and middle levels with at least one electrically conductive spring means;
   fixing a wall which encloses said lower and middle levels to said heat dissipating base; and
   providing the portion of the module bounded by said wall and said base with at least a first layer of a soft resin material to absorb any thermal expansion which occurs in said power circuits.

7. The method according to claim 6, further comprising:
   welding a lower end of said spring means to a desired position in said lower level;
   positioning said spring means with a guide plate means, said guide plate means having holes disposed therein to receive said spring means, said spring means comprising a helical spring; and
   welding an upper end of said spring means to a desired position on said middle level.

8. The method according to claim 6, further comprising forming a seat on said wall to receive said middle level substrate.

* * * * *